United States Patent
Geng et al.

(10) Patent No.: US 9,953,555 B2
(45) Date of Patent: Apr. 24, 2018

(54) DRIVING CIRCUIT FOR TOUCH SCREEN, IN-CELL TOUCH SCREEN AND DISPLAY APPARATUS

(71) Applicants: BOE TECHNOLOGY GROUP CO., LTD., Beijing (CN); BEIJING BOE DISPLAY TECHNOLOGY CO., LTD., Beijing (CN)

(72) Inventors: Weibiao Geng, Beijing (CN); Yichiang Lai, Beijing (CN); Chunbing Zhang, Beijing (CN); Liang Zhang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/522,621

(22) PCT Filed: Oct. 11, 2016

(86) PCT No.: PCT/CN2016/101805
§ 371 (c)(1),
(2) Date: Apr. 27, 2017

(87) PCT Pub. No.: WO2017/067407
PCT Pub. Date: Apr. 27, 2017

(65) Prior Publication Data
US 2017/0337862 A1    Nov. 23, 2017

(30) Foreign Application Priority Data
Oct. 20, 2015   (CN) .......................... 2015 1 0684124

(51) Int. Cl.
G06F 3/041    (2006.01)
G09G 3/20    (2006.01)
(Continued)

(52) U.S. Cl.
CPC ............... *G09G 3/20* (2013.01); *G06F 3/044* (2013.01); *G06F 3/0412* (2013.01); *G11C 19/28* (2013.01);
(Continued)

(58) Field of Classification Search
CPC ....... G06F 3/0412; G06F 3/044; G11C 19/28; G09G 3/20
(Continued)

(56) References Cited

U.S. PATENT DOCUMENTS 5,166,970 A * 11/1992 Ward .................... G01R 31/023
324/542
7,683,878 B2 * 3/2010 Luo .......................... G09G 3/20
345/100

(Continued)

FOREIGN PATENT DOCUMENTS

CN     103943055 A    7/2014
CN     103943083 A    7/2014
(Continued)

OTHER PUBLICATIONS

International Search Report and Written Opinion dated Dec. 28, 2016; PCT/CN2016/101805.
(Continued)

*Primary Examiner* — Prabodh M Dharia
(74) *Attorney, Agent, or Firm* — Ladas & Parry LLP; Loren K. Thompson

(57) ABSTRACT

A driving circuit for a touch screen, an in-cell touch screen and a display apparatus. A timing controller of the driving circuit controls a power supply circuit to output a clock signal with a first amplitude to an $(N+1-n)^{th}$-stage to an $N^{th}$-stage shift registers (SR(n)) in a first time period at a display stage, and controls the power supply circuit to output a clock signal with a second amplitude to each stage of shift
(Continued)

register (SR(n)) in a second time period at the display stage; and then levels of scanning signals output by the (N+1−n)$^{th}$-stage to the N$^{th}$-stage shift registers (SR(n)) are higher than levels of scanning signals output by other stages of shift registers (SR(n)).

20 Claims, 6 Drawing Sheets

(51) Int. Cl.
    *G06F 3/044*      (2006.01)
    *G11C 19/28*      (2006.01)

(52) U.S. Cl.
    CPC ............... *G09G 2310/0286* (2013.01); *G09G 2310/0289* (2013.01)

(58) Field of Classification Search
    USPC .................. 345/156–184, 214; 377/64, 116; 711/167; 327/108
    See application file for complete search history.

(56) References Cited

U.S. PATENT DOCUMENTS

| | | | | |
|---|---|---|---|---|
| 9,041,693 | B2* | 5/2015 | Chung | G09G 3/3266 345/100 |
| 2006/0007085 | A1* | 1/2006 | Kim | G09G 3/3677 345/87 |
| 2008/0284710 | A1* | 11/2008 | Kimura | G02F 1/13454 345/98 |
| 2013/0043911 | A1* | 2/2013 | Kimura | G09G 3/3677 327/108 |
| 2014/0168044 | A1* | 6/2014 | Hu | G09G 3/3696 345/90 |
| 2014/0198087 | A1 | 7/2014 | Knausz et al. | |
| 2015/0077615 | A1* | 3/2015 | Yamazaki | G09G 3/3233 348/333.01 |
| 2015/0279272 | A1* | 10/2015 | Takahara | G09G 3/3266 345/76 |
| 2015/0325312 | A1* | 11/2015 | Umezaki | G11C 19/184 377/64 |
| 2016/0026312 | A1* | 1/2016 | Park | G06F 3/0412 345/174 |
| 2017/0017326 | A1* | 1/2017 | Wu | G09G 3/2096 |
| 2017/0132967 | A1* | 5/2017 | Liu | G09G 3/2092 |
| 2017/0221441 | A1* | 8/2017 | Gu | G09G 3/3648 |

FOREIGN PATENT DOCUMENTS

| | | |
|---|---|---|
| CN | 104821159 A | 8/2015 |
| CN | 104916251 A | 9/2015 |
| CN | 105139798 A | 12/2015 |
| CN | 205028629 U | 2/2016 |

OTHER PUBLICATIONS

The First Chinese Office Action dated May 25, 2017; Appln. No. 201510684124.0.

* cited by examiner

US 9,953,555 B2

DRIVING CIRCUIT FOR TOUCH SCREEN, IN-CELL TOUCH SCREEN AND DISPLAY APPARATUS

TECHNICAL FIELD

Embodiments of the present disclosure relate to a driving circuit for a touch screen, an in-cell touch screen and a display apparatus.

BACKGROUND

With fast development of the display technology, displays show development trends of high integration level and low cost. A Gate Driver on Array (GOA) technology integrates a thin film transistor (TFT) gate switching circuit on an array substrate of a display panel for carrying out scanning driving on the display panel, so that a bonding region for a gate Integrated Circuit (IC) and a wiring space for a fan-out region on the display panel can be omitted. By adopting the GOA technology, not only product cost can be reduced in two aspects, material cost and production process, but also the display panel can achieve attractive design in both symmetric profile and narrow frame; and moreover, this integrated process can further omit a bonding process for a gate scanning line, so that capacity and yield are improved.

Generally, a gate driving circuit is formed by a plurality of cascaded shift registers, and an output signal end of each stage of shift register respectively corresponds to one gate line and is configured for sequentially outputting scanning signals line by line to a plurality of gate lines. With a higher and higher resolution required by a large-sized display, the gate driving circuit is generally implemented by pre-charging, i.e., each stage of shift register in the gate driving circuit sequentially outputs, and each clock signal sequentially has an overlap of 1/n of a pulse width, that is, the scanning signal output by a current stage of shift register and the scanning signal output by a previous stage of shift register have the overlap of 1/n of the pulse width.

SUMMARY

Embodiments of the present disclosure provide a driving circuit for a touch screen, an in-cell touch screen and a display apparatus, and can solve a problem that due to attenuation of scanning signals output by an $(N+1-n)^{th}$-stage to an $N^{th}$-stage shift registers in a touch period, rise time of scanning signals output by the $(N+1)^{th}$-stage to the $(N+n)^{th}$-stage shift registers is relatively long so as to cause cases that charging time of an $(N+1)^{th}$, an $(N+2)^{th}$ and an $(N+3)^{th}$ rows of pixel units is shortened and corresponding image display effects are dark.

An embodiment of the disclosure provides a driving circuit for a touch screen, comprising: a gate driving circuit consisting of M stages of cascaded shift registers, a power supply circuit for supplying a clock signal to each shift register in the gate driving circuit; and a timing controller; in the gate driving circuit, except an (M+1-n)th-stage to an Mth-stage shift registers, an output signal end of each stage of shift register is respectively connected with an input signal end of an nth-stage shift register behind the each stage of shift register, where n is a positive integer greater than 0 and smaller than M; and the timing controller is configured for: in a touch period, controlling the power supply circuit to output a clock signal with an amplitude of 0 to each stage of shift register, wherein the touch period is a preset time period after an Nth-stage shift register outputs a scanning signal and before an (N+1)th-stage shift register starts to output the scanning signal, and N is a positive integer greater than n and smaller than M; and at a display stage, controlling the power supply circuit to output a clock signal with a first amplitude to an (N+1-n)th-stage to an Nth-stage shift registers in a first time period, and controlling the power supply circuit to output a clock signal with a second amplitude to each stage of shift register in a second time period, wherein the first time period is a time period when the (N+1-n)th-stage to the Nth-stage shift registers output the scanning signals, and the second time period is a time period in a display period except the first time period, and the first amplitude of the clock signal is greater than the second amplitude.

For example, in the driving circuit according to an embodiment of the present disclosure, the timing controller is further configured for detecting an output situation of each stage of shift register in the gate driving circuit in the display period, and a time period when all stage numbers of the shift registers which output the scanning signals are in a range of the (N−1−n)th stage to the Nth stage is determined as the first time period, and a time period when all stage numbers of the shift registers which output the scanning signals are not in the range of the (N−1−n)th stage to the Nth stage is determined as the second time period.

For example, in the driving circuit according to an embodiment of the present disclosure, the timing controller includes a detection circuit and a control circuit connected between the detection circuit and the power supply circuit; the detection circuit is configured for: detecting the output situation of each stage of shift register in the gate driving circuit at the display stage, determining the time period when all the stage numbers of the shift registers which output the scanning signals are in the range of N−1−n to N as the first time period, outputting a first control signal to the control circuit in the first time period, determining the time period when all the stage numbers of the shift registers which output the scanning signals are not in the range of N−1−n to N as the second time period, and outputting a second control signal to the control circuit in the second time period; and the control circuit is configured for: upon receiving the first control signal sent by the detection circuit, controlling the power supply circuit to output the clock signal with the first amplitude to the (N+1−n)th-stage to the Nth-stage shift registers; and upon receiving the second control signal sent by the detection circuit, controlling the power supply circuit to output the clock signal with the second amplitude to each stage of shift register.

For example, in the driving circuit according to an embodiment of the present disclosure, the timing controller includes: a detection circuit, a first control circuit connected between the detection circuit and the power supply circuit, and a second control circuit connected between the detection circuit and the power supply circuit; the detection circuit is configured for: detecting the output situation of each stage of shift register in the gate driving circuit in the display stage, determining the time period when all the stage numbers of the shift registers which output the scanning signals are in the range of N−1−n to N as the first time period, outputting a control signal to the first control circuit in the first time period, determining the time period when all the stage numbers of the shift registers which output the scanning signals are not in the range of N−1−n to N as the second time period, and outputting a control signal to the second control circuit in the second time period; the first control circuit is configured for: upon receiving the control signal sent by the detection circuit, controlling the power supply circuit to output the clock signal with the first amplitude to the (N+1−n)th-stage to the Nth-stage shift registers; and the second control circuit is configured for: upon receiving the control signal sent by the detection circuit, controlling the power supply circuit to output the clock signal with the second amplitude to each stage of shift register.

For example, in the driving circuit according to an embodiment of the present disclosure, the power supply circuit includes: a power sub-circuit connected with the timing controller, and a level conversion sub-circuit connected between the power sub-circuit and each stage of shift register; the power sub-circuit is configured for: in the first time period, under control of the timing controller, simultaneously outputting a first high-level voltage and a low-level voltage to the level conversion sub-circuit; and in the second time period, under control of the timing controller, simultaneously outputting a second high-level voltage and the low-level voltage to the level conversion sub-circuit, wherein the first high-level voltage is higher than the second high-level voltage; and the level conversion sub-circuit is configured for: upon receiving the first high-level voltage and the low-level voltage which are provided by the power sub-circuit, outputting the clock signal with the first amplitude to each stage of shift register; and upon receiving the second high-level voltage and the low-level voltage which are provided by the power sub-circuit, outputting the clock signal with the second amplitude to each stage of shift register.

For example, in the driving circuit according to an embodiment of the present disclosure, the first amplitude is equal to a difference between the first high-level voltage and the low-level voltage, and the second amplitude is equal to a difference between the second high-level voltage and the low-level voltage.

For example, in the driving circuit according to an embodiment of the present disclosure, the timing controller is connected with the power supply circuit by an Inter-Integrated Circuit (I2C) interface.

For example, in the driving circuit according to an embodiment of the present disclosure, the longer the touch period is, the greater a difference between the first amplitude and the second amplitude is.

Another embodiment of the present disclosure provides an in-cell touch screen, comprising any one of the above described driving circuits provided by the embodiments of the present disclosure.

Another embodiment of the present disclosure provides a display apparatus, comprising the above-described in-cell touch screen.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 1b is a timing diagram corresponding to the gate driving circuit as illustrated in FIG. 1a;

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Specific implementation modes of a driving circuit for a touch screen, an in-cell touch screen and a display apparatus which are provided by embodiments of the present disclosure will be illustrated in details in connection with drawings.

Figure 1A:
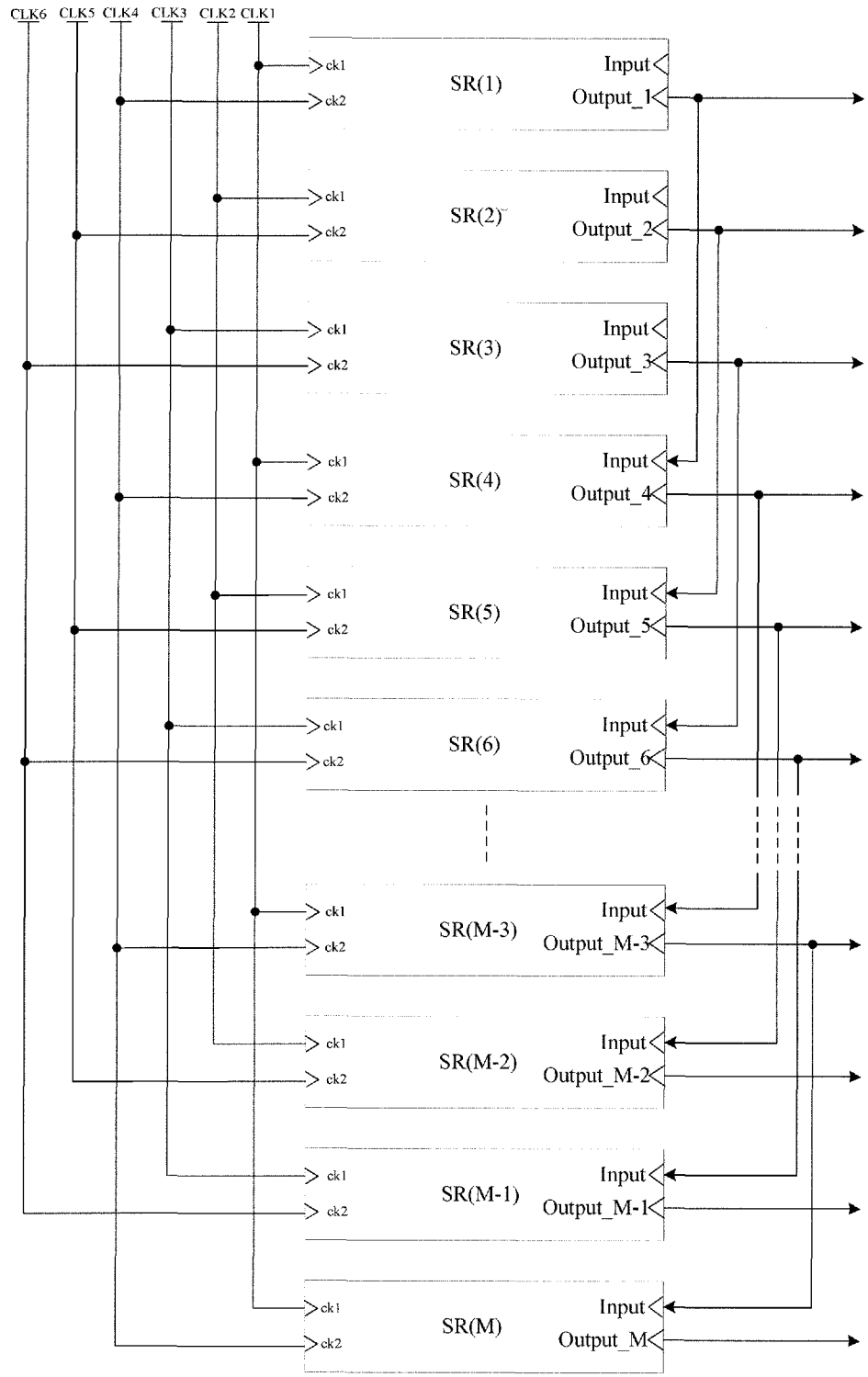
FIG. 1a is a structural schematic diagram of a gate driving circuit.
Figure 1B:
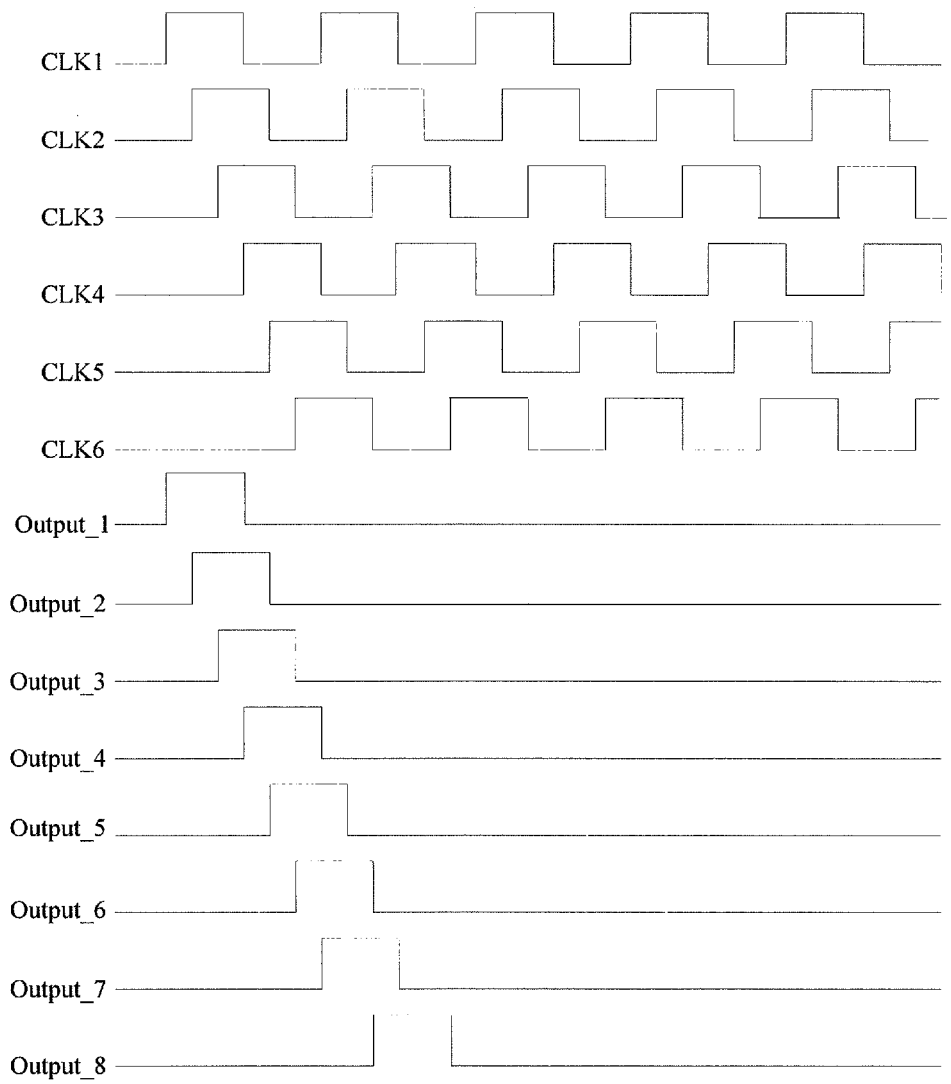

FIG. 1a is a structural schematic diagram of a gate driving circuit; here by taking n=3 as an example, the gate driving circuit generally needs to be connected with six clock signal lines (CLK1, CLK2, CLK3, CLK4, CLK5 and CLK6), and in this gate driving circuit, except last three stages of shift registers (SR(M), SR(M−1) and SR(M−2) as illustrated in FIG. 1a), an output signal end Output_m of each stage of shift register SR(m) is respectively connected with an input signal end Input of a third stage of shift register SR(m+3) behind this stage of shift register SR(m). A timing diagram corresponding to the gate driving circuit is as illustrated in FIG. 1b, and FIG. 1b only shows timing sequences of scanning signals output by the output signal ends Output of first eight stages of shift registers to corresponding gate lines in a display region of a display panel.

Figure 1C:
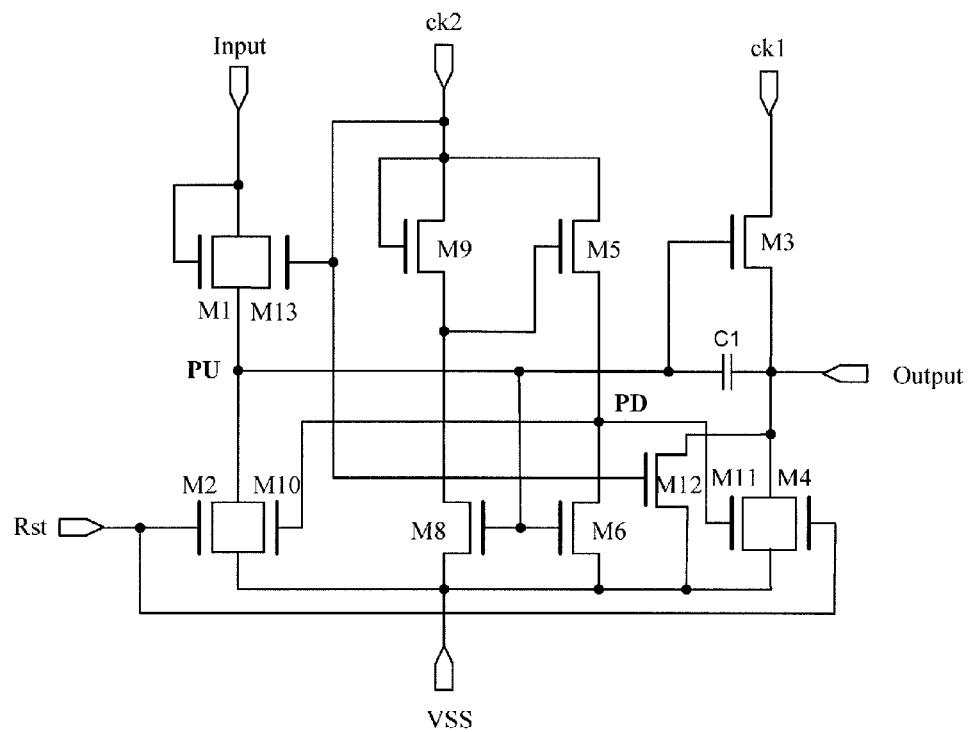
FIG. 1c is a structural schematic diagram of a shift register.

However, in a display apparatus which realizes a touch process and a display process in a time division driving mode, a plurality of touch periods need to be inserted in a time period when one frame is displayed, and by taking n=3 and the shift register illustrated in FIG. 1c as example, assuming that a touch period is inserted after an $N^{th}$-stage shift register outputs a scanning signal and before an $(N+1)^{th}$-stage shift register starts to output a scanning signal, in the touch period, input signals to the input signal ends Input of the $(N+1)^{th}$-stage, an $(N+2)^{th}$-stage and an $(N+3)^{th}$-stage shift registers have become effective, and the voltages of corresponding pull-up nodes PU have been pulled up, but due to existence of leakage currents, the voltages of the pull-up nodes PU suffer from dropping, resulting in insufficient opening degrees of the switching transistors M3 of the $(N+1)^{th}$-stage, the $(N+2)^{th}$-stage and the $(N+3)^{th}$-stage shift registers after the touch period is ended, so that when a clock signal end ck1 is at a high level, the rising time period of the scanning signal output by the output signal end Output is prolonged due to insufficient charging capability of the switching transistors M3, thereby causing the consequence that the charging durations of the $(N+1)^{th}$, the $(N+2)^{th}$ and the $(N+3)^{th}$ rows of pixel units are shortened and image display effects corresponding to the three rows of pixel units may become dark.

Figure 2:
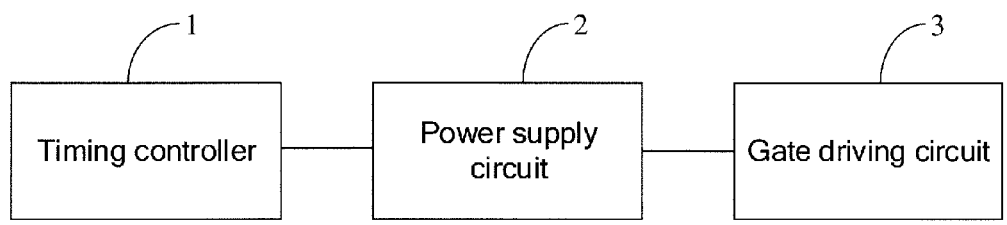
FIG. 2 is a structural schematic diagram of a driving circuit for a touch screen, which is provided by an embodiment of the present disclosure.

An embodiment of the present disclosure provides a driving circuit for a touch screen. As illustrated in FIG. 2, the driving circuit includes a gate driving circuit 3 comprising M stages of cascaded shift registers (the M stages of shift registers are not illustrated in FIG. 2), and includes a power supply circuit 2 for supplying a clock signal to each shift register in the gate driving circuit 3. A cascade configuration of the gate driving circuit 3 may be as illustrated in FIG. 1a (in FIG. 1a, the case that n=3 is taken as an example), except an $(M+1-n)^{th}$-stage to an $M^{th}$-stage shift registers (SR(M+1-n), . . . , SR(M)), an output signal end Output_m of each stage of shift register SR(m) is respectively connected with an input signal end Input of an $n^{th}$-stage shift register SR(m+n) behind the stage of shift register, where n is a positive integer greater than 0 and smaller than M, M is a positive integer, for example, greater than or equal to 3, and for a common display apparatus, for example, M may be equal to 360, 800, 1024, 1920 or the like; and the driving circuit further includes a timing controller 1. In the embodiment of the present disclosure, the structure of the gate driving circuit 3 is not limited to the case as illustrated in FIG. 1a.

Figure 1D:
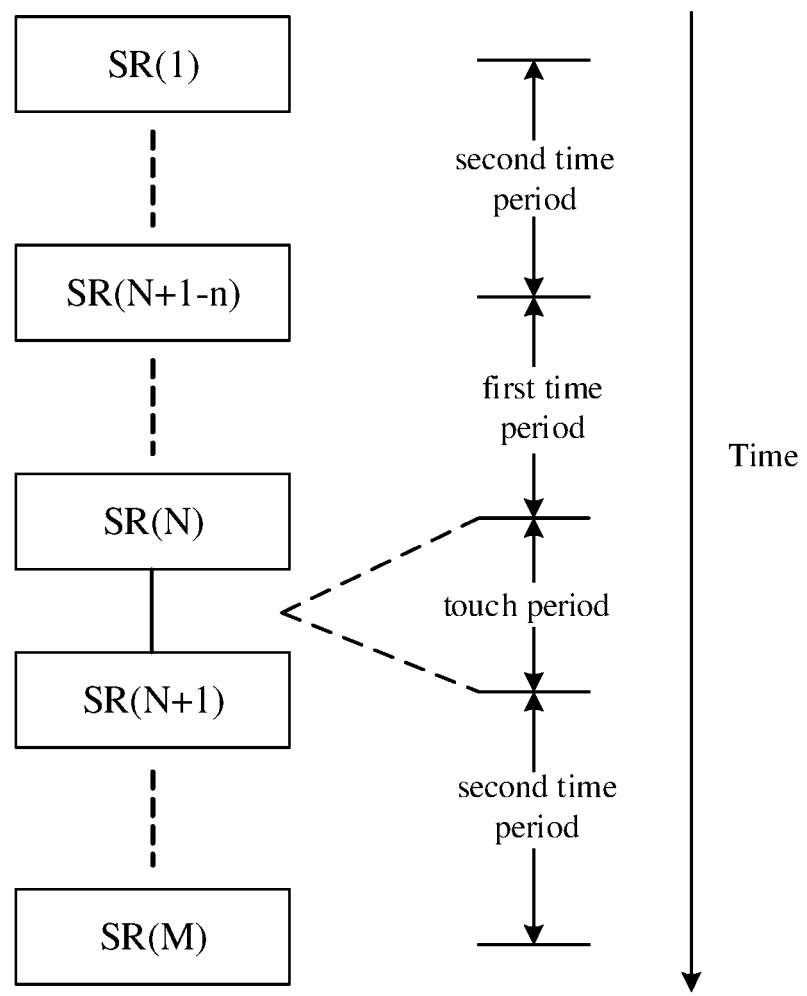
FIG. 1d is a schematic diagram of the first time period, the second time period and the touch period.

The timing controller 1 is configured for: in a touch period, controlling the power supply circuit 2 to output a clock signal with an amplitude of 0 to each stage of shift register, the touch period being a preset time period after an $N^{th}$-stage shift register SR(N) outputs a scanning signal and before an $(N+1)^{th}$-stage shift register starts to output the scanning signal (as illustrated in FIG. 1d), and N being a positive integer greater than n and smaller than M; and at a display stage, controlling the power supply circuit 2 to output a clock signal with a first amplitude to the $(N+1-n)^{th}$-stage to the $N^{th}$-stage shift registers in a first time period, and controlling the power supply circuit 2 to output a clock signal with a second amplitude to each stage of shift register in a second time period. The first time period is a time period when the $(N+1-n)^{th}$-stage to the $N^{th}$-stage shift registers output the scanning signals, and the second time period is a time period in a display period except the first time period; and the first amplitude of the clock signal is greater than the second amplitude (as illustrated in FIG. 1d).

According to the driving circuit provided by the embodiment of the present disclosure, the timing controller controls the power supply circuit to output the clock signal with the first amplitude to the $(N+1-n)^{th}$-stage to the $N^{th}$-stage shift registers in the first time period in the display stage, and controls the power supply circuit to output the clock signal with the second amplitude to each stage of shift register in the second time period in the display stage; and then levels of the scanning signals output by n stages of shift registers from the $(N+1-n)^{th}$ stage to the $N^{th}$ stage are higher than levels of scanning signals output by other stages of shift registers, so that even though the scanning signals may attenuate in the touch period, levels after attenuation still can enable the $(N+1)^{th}$-stage to the $(N+n)^{th}$-stage shift registers to normally output, thereby further solving the problem of the dark display effect generated due to short charging time of the $(N+1)^{th}$ to $(N+n)^{th}$ rows of pixel units, which is caused by the attenuation of the scanning signals in the touch period.

It should be noted that according to the driving circuit provided by an embodiment of the present disclosure, N may be any one or more positive integers greater than n and smaller than M; when N only represents one positive integer, it means that only one touch period is inserted in a time period when one frame of image is scanned; and when N represents a plurality of positive integers, it means that a plurality of touch periods are inserted in the time period when one frame is scanned.

For example, in the driving circuit provided by an embodiment of the present disclosure, the longer the touch period is, the greater a difference between the first amplitude and the second amplitude is. This is because that the longer the touch period is, the higher an attenuation degree of the scanning signals is caused after the touch period. Therefore, in order to enable the levels of the attenuated scanning signals to meet the requirement of a node voltage, the difference between the first amplitude and the second amplitude can become great.

For example, in the driving circuit provided by an embodiment of the present disclosure, the timing controller can further be configured for: detecting an output situation of each stage of shift register in the gate driving circuit in the display stage; and determining a time period when all stage numbers of the shift registers which output the scanning signals are in a range of the $(N-1-n)^{th}$ to the $N^{th}$ stages as the first time period, and determining a time period when all the stage numbers of the shift registers which output the scanning signals are not in the range of the $(N-1-n)^{th}$ to the $N^{th}$ stages as the second time period.

Examples of the driving circuit provided by the embodiment of the present disclosure will be illustrated in details in connection with drawings.

Figure 3A:
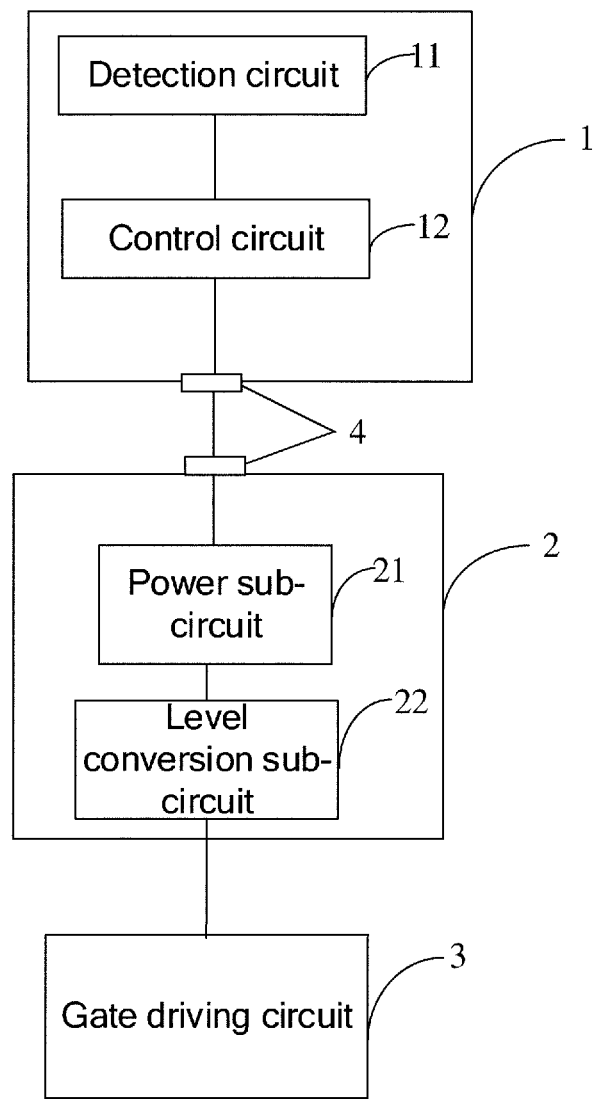
FIG. 3a and FIG. 3b respectively are specific structural schematic diagrams of the driving circuit provided by the embodiment of the present disclosure.

For example, in the driving circuit provided by an embodiment of the present disclosure, as illustrated in FIG. 3a, in one example, the timing controller 1 includes: a detection circuit 11, and a control circuit 12 connected between the detection circuit 11, and the power supply circuit 2.

The detection circuit 11 is configured for: detecting the output situation of each stage of shift register in the gate driving circuit 3 in the display stage, determining the time period when all the stage numbers of the shift registers which output the scanning signals are in the range of N−1−n to N as the first time period, outputting a first control signal to the control circuit 12 in the first time period, determining the time period when all the stage numbers of the shift registers which output the scanning signals are not in the range of N−1−n to N as the second time period, and outputting a second control signal to the control circuit 12 in the second time period; and the control circuit 12 is configured for: upon receiving the first control signal sent by the detection circuit 11, controlling the power supply circuit 2 to output the clock signal with the first amplitude to the $(N+1-n)^{th}$-stage to the $N^{th}$-stage shift registers; and upon receiving the second control signal sent by the detection circuit 11, controlling the power supply circuit 2 to output the clock signal with the second amplitude to each stage of shift register.

Figure 3B:
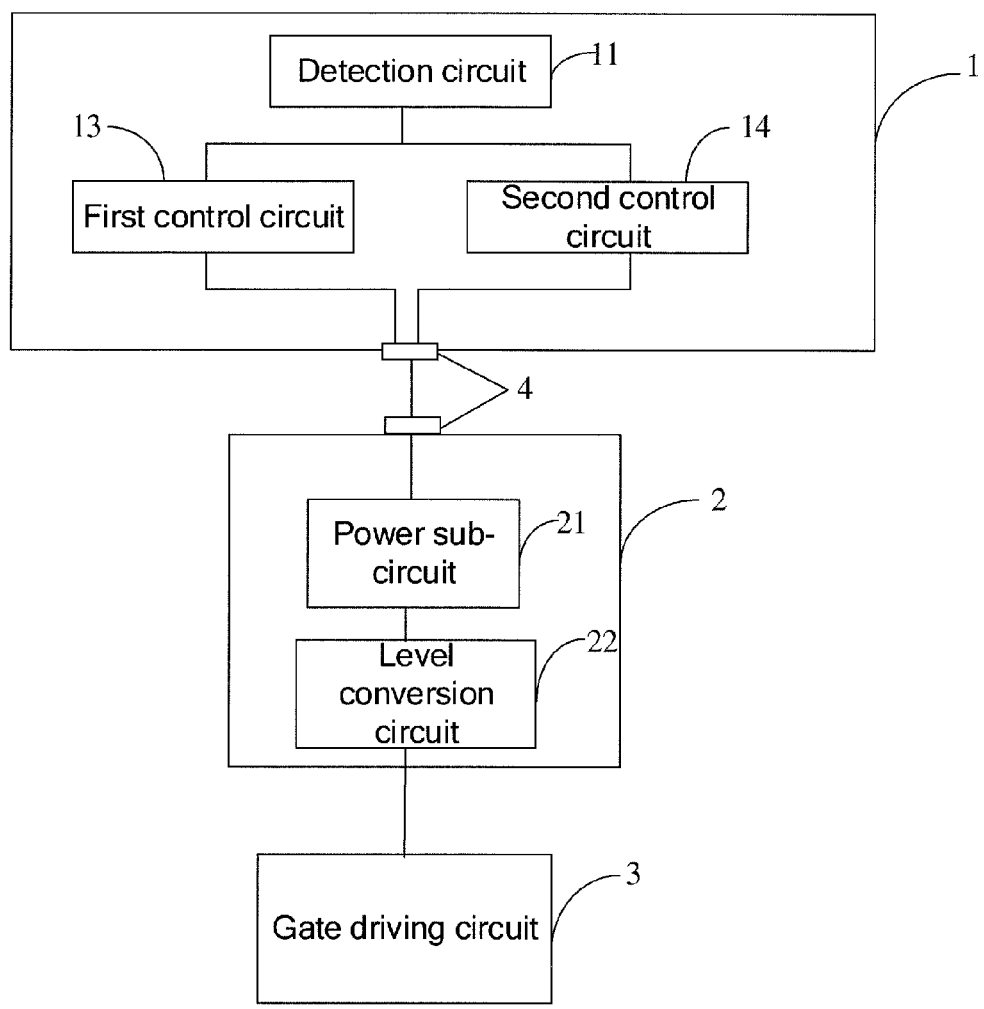

Or, for example, in the driving circuit provided by an embodiment of the present disclosure, as illustrated in FIG. 3b, in another example, the timing controller 1 may include: a detection circuit 11, a first control circuit 13 connected between the detection circuit 11 and the power supply circuit 2, and a second control circuit 14 connected between the detection circuit 11 and the power supply circuit 2.

The detection circuit 11 is configured for: detecting the output situation of each stage of shift register in the gate driving circuit 3 in the display stage, determining the time period when all the stage numbers of the shift registers which output the scanning signals are in the range of N−1−n to N as the first time period, outputting a control signal to the first control circuit 13 in the first time period, determining the time period when all the stage numbers of the shift registers which output the scanning signals are not in the range of N−1−n to N as the second time period, and outputting a control signal to the second control circuit 14 in the second time period.

The first control circuit 13 is configured for: upon receiving the control signal sent by the detection circuit 11, controlling the power supply circuit 2 to output the clock signal with the first amplitude to the $(N+1-n)^{th}$-stage to the $N^{th}$-stage shift registers.

The second control circuit 14 is configured for: upon receiving the control signal sent by the detection circuit 11, controlling the power supply circuit 2 to output the clock signal with the second amplitude to each stage of shift register.

In the timing controller provided by the embodiment of the present disclosure, the detection circuit, the control circuit, the first control circuit or the second control circuit all can be implemented by a physical semiconductor circuit or chip.

For example, in the driving circuit provided by an embodiment of the present disclosure, as illustrated in FIG. 3a and FIG. 3b, the power supply circuit 2 may include: a power sub-circuit 21 connected with the timing controller 1, and a level conversion sub-circuit 22 connected between the power sub-circuit 21 and each stage of shift register.

The power sub-circuit 21 is configured for: in the first time period, under control of the timing controller 1, simultaneously outputting a first high-level voltage and a low-level voltage to the level conversion sub-circuit 22; and in the second time period, under control of the timing controller 1, simultaneously outputting a second high-level voltage and the low-level voltage to the level conversion sub-circuit 22; the first high-level voltage is higher than the second high-level voltage.

The level conversion sub-circuit 22 is configured for: upon receiving the first high-level voltage and the low-level voltage which are provided by the power sub-circuit 21, outputting the clock signal with the first amplitude to each stage of shift register; and upon receiving the second high-level voltage and the low-level voltage which are provided by the power sub-circuit 21, outputting the clock signal with the second amplitude to each stage of shift register.

For example, in the driving circuit provided by the embodiment of the present disclosure, the first amplitude may be equal to a difference between the first high-level voltage and the low-level voltage, and the second amplitude may be equal to a difference between the second high-level voltage and the low-level voltage.

For example, in the driving circuit provided by the embodiment of the present disclosure, the power sub-circuit may be a DC-DC (Direct Current to Direct Current) converter, and certainly, the power sub-circuit also may be other hardware capable of achieving the same functions, which is not limited herein.

For example, in the driving circuit provided by an embodiment of the present disclosure, the level conversion sub-circuit may be a level converter, and certainly, the level conversion sub-circuit also may be of other hardware capable of achieving the same functions, which is not limited herein.

For example, in the driving circuit provided by an embodiment of the present disclosure, as illustrated in FIG. 3a and FIG. 3b, the timing controller 1 may be connected with the power supply circuit 2 by an Inter-Integrated Circuit (I2C) interface 4. An I2C bus is a two-line serial bus, is generally configured for connecting a microcontroller and a peripheral equipment thereof, and currently, and is a bus standard widely adopted in the field of micro-electronics communication control. In an embodiment of the present disclosure, other types of serial or parallel interfaces also may be adopted between the timing controller 1 and the power supply circuit 2.

Based on the same inventive concept, an embodiment of the present disclosure further provides an in-cell touch screen, including any one driving circuit for the touch screen, which is provided by the embodiment of the present disclosure. The driving circuit provides a scanning signal for each gate line in a display region. The in-cell touch screen may adopt a capacitive touch scheme and may be a self-capacitance type or a mutual-capacitance type touch screen, but the embodiments of the present disclosure are not limited to the specific implementation mode of touch detection. Moreover, the in-cell touch screen may include a display panel, e.g., a liquid crystal display (LCD), an organic light emitting diode (OLED) or electronic paper or the like.

A principle of the in-cell touch screen for solving the problem is similar to that of the above-mentioned driving circuit, and thus, implementation of the in-cell touch screen can refer to implementation of the above-mentioned driving circuit, and is not repeated herein.

Based on the same inventive concept, an embodiment of the present disclosure further provides a display apparatus, including the in-cell touch screen provided by the embodiment of the present disclosure. The display apparatus may be any product or part with a display function, e.g., a mobile phone, a tablet personal computer, a television, a display, a notebook computer, a digital photo frame, a navigator and the like. Implementation of the display apparatus can refer to the embodiment of the in-cell touch screen, and is not repeated herein.

According to the driving circuit for the touch screen, the in-cell touch screen and the display apparatus which are provided by the embodiments of the present disclosure, the timing controller controls the power supply circuit to output the clock signal with the first amplitude to the $(N+1-n)^{th}$-stage to the $N^{th}$-stage shift registers in the first time period in the display stage, and controls the power supply circuit to output the clock signal with the second amplitude to each stage of shift register in the second time period in the display stage; and then the levels of the scanning signals output by n stages of shift registers from the $(N+1-n)^{th}$ stage to the $N^{th}$ stage are higher than the levels of the scanning signals output by other stages of shift registers, so that even though the scanning signals may attenuate in the touch period, the levels after attenuation still can enable the $(N+1)^{th}$-stage to the $(N+n)^{th}$-stage shift registers to normally output, thereby further solving the problem of the dark display effect generated due to short charging time of the $(N+1)^{th}$ to the $(N+n)^{th}$ rows of pixel units, which is caused by the attenuation of the scanning signals in the touch period.

What are described above is related to the illustrative embodiments of the disclosure only and not limitative to the scope of the disclosure; the scopes of the disclosure are defined by the accompanying claims.

The application claims priority to the Chinese patent application No. 201510684124.0, filed Oct. 20, 2015, the entire disclosure of which is incorporated herein by reference as part of the present application.

What is claimed is:

1. A driving circuit for a touch screen, comprising:
a gate driving circuit consisting of M stages of cascaded shift registers, wherein M is a positive integer larger than or equal to 3,
a power supply circuit for supplying a clock signal to each shift register in the gate driving circuit; and
a timing controller,
wherein in the gate driving circuit, except an $(M+1-n)^{th}$-stage to an $M^{th}$-stage shift registers, an output signal end of each stage of shift register is respectively connected with an input signal end of an $n^{th}$-stage shift register behind the each stage of shift register, where n is a positive integer greater than 0 and smaller than M; and the timing controller is configured for:
in a touch period, controlling the power supply circuit to output a clock signal with an amplitude of 0 to each stage of shift register, wherein the touch period is a preset time period after an $N^{th}$-stage shift register outputs a scanning signal and before an $(N+1)^{th}$-stage shift register starts to output the scanning signal, and N is a positive integer greater than n and smaller than M; and
at a display stage, controlling the power supply circuit to output a clock signal with a first amplitude to an $(N+1-n)^{th}$-stage to an $N^{th}$-stage shift registers in a first time period, and controlling the power supply circuit to output a clock signal with a second amplitude to each stage of shift register in a second time period,
wherein the first time period is a time period when the $(N+1-n)^{th}$-stage to the $N^{th}$-stage shift registers output the scanning signals, and the second time period is a time period in a display period except the first time period, and the first amplitude of the clock signal is greater than the second amplitude.

2. The driving circuit according to claim 1, wherein the timing controller is further configured for detecting an output situation of each stage of shift register in the gate driving circuit in the display period, and
wherein a time period when all stage numbers of the shift registers which output the scanning signals are in a range of the $(N-1-n)^{th}$ stage to the $N^{th}$ stage is determined as the first time period, and a time period when all stage numbers of the shift registers which output the scanning signals are not in the range of the $(N-1-n)^{th}$ stage to the $N^{th}$ stage is determined as the second time period.

3. The driving circuit according to claim 2, wherein the timing controller includes a detection circuit and a control circuit connected between the detection circuit and the power supply circuit, wherein
the detection circuit is configured for: detecting the output situation of each stage of shift register in the gate driving circuit at the display stage, determining the time period when all the stage numbers of the shift registers which output the scanning signals are in the range of N−1−n to N as the first time period, outputting a first control signal to the control circuit in the first time period, determining the time period when all the stage numbers of the shift registers which output the scanning signals are not in the range of N−1−n to N as the second time period, and outputting a second control signal to the control circuit in the second time period; and
the control circuit is configured for: upon receiving the first control signal sent by the detection circuit, controlling the power supply circuit to output the clock signal with the first amplitude to the $(N+1-n)^{th}$-stage to the $N^{th}$-stage shift registers; and upon receiving the second control signal sent by the detection circuit, controlling the power supply circuit to output the clock signal with the second amplitude to each stage of shift register.

4. The driving circuit according to claim 3, wherein the power supply circuit includes: a power sub-circuit connected with the timing controller, and a level conversion sub-circuit connected between the power sub-circuit and each stage of shift register, wherein
the power sub-circuit is configured for: in the first time period, under control of the timing controller, simultaneously outputting a first high-level voltage and a low-level voltage to the level conversion sub-circuit; and in the second time period, under control of the timing controller, simultaneously outputting a second high-level voltage and the low-level voltage to the level conversion sub-circuit, wherein the first high-level voltage is higher than the second high-level voltage; and
the level conversion sub-circuit is configured for: upon receiving the first high-level voltage and the low-level voltage which are provided by the power sub-circuit, outputting the clock signal with the first amplitude to each stage of shift register; and upon receiving the second high-level voltage and the low-level voltage which are provided by the power sub-circuit, outputting the clock signal with the second amplitude to each stage of shift register.

5. The driving circuit according to claim 4, wherein the first amplitude is equal to a difference between the first high-level voltage and the low-level voltage, and the second amplitude is equal to a difference between the second high-level voltage and the low-level voltage.

6. The driving circuit according to claim 4, wherein the timing controller is connected with the power supply circuit by an Inter-Integrated Circuit (I2C) interface.

7. The driving circuit according to claim 3, wherein the longer the touch period is, the greater a difference between the first amplitude and the second amplitude is.

8. The driving circuit according to claim 2, wherein the timing controller includes: a detection circuit, a first control circuit connected between the detection circuit and the power supply circuit, and a second control circuit connected between the detection circuit and the power supply circuit, wherein
the detection circuit is configured for: detecting the output situation of each stage of shift register in the gate driving circuit in the display stage, determining the time period when all the stage numbers of the shift registers which output the scanning signals are in the range of N−1−n to N as the first time period, outputting a control signal to the first control circuit in the first time period, determining the time period when all the stage numbers of the shift registers which output the scanning signals are not in the range of N−1−n to N as the second time period, and outputting a control signal to the second control circuit in the second time period;

the first control circuit is configured for: upon receiving the control signal sent by the detection circuit, controlling the power supply circuit to output the clock signal with the first amplitude to the $(N+1-n)^{th}$-stage to the $N^{th}$-stage shift registers; and the second control circuit is configured for: upon receiving the control signal sent by the detection circuit, controlling the power supply circuit to output the clock signal with the second amplitude to each stage of shift register.

9. The driving circuit according to claim 8, wherein the power supply circuit includes: a power sub-circuit connected with the timing controller, and a level conversion sub-circuit connected between the power sub-circuit and each stage of shift register, wherein the power sub-circuit is configured for: in the first time period, under control of the timing controller, simultaneously outputting a first high-level voltage and a low-level voltage to the level conversion sub-circuit; and in the second time period, under control of the timing controller, simultaneously outputting a second high-level voltage and the low-level voltage to the level conversion sub-circuit, wherein the first high-level voltage is higher than the second high-level voltage; and the level conversion sub-circuit is configured for: upon receiving the first high-level voltage and the low-level voltage which are provided by the power sub-circuit, outputting the clock signal with the first amplitude to each stage of shift register; and upon receiving the second high-level voltage and the low-level voltage which are provided by the power sub-circuit, outputting the clock signal with the second amplitude to each stage of shift register.

10. The driving circuit according to claim 8, wherein the longer the touch period is, the greater a difference between the first amplitude and the second amplitude is.

11. The driving circuit according to claim 2, wherein the power supply circuit includes: a power sub-circuit connected with the timing controller, and a level conversion sub-circuit connected between the power sub-circuit and each stage of shift register, wherein the power sub-circuit is configured for: in the first time period, under control of the timing controller, simultaneously outputting a first high-level voltage and a low-level voltage to the level conversion sub-circuit; and in the second time period, under control of the timing controller, simultaneously outputting a second high-level voltage and the low-level voltage to the level conversion sub-circuit, wherein the first high-level voltage is higher than the second high-level voltage; and the level conversion sub-circuit is configured for: upon receiving the first high-level voltage and the low-level voltage which are provided by the power sub-circuit, outputting the clock signal with the first amplitude to each stage of shift register; and upon receiving the second high-level voltage and the low-level voltage which are provided by the power sub-circuit, outputting the clock signal with the second amplitude to each stage of shift register.

12. The driving circuit according to claim 11, wherein the first amplitude is equal to a difference between the first high-level voltage and the low-level voltage, and the second amplitude is equal to a difference between the second high-level voltage and the low-level voltage.

13. The driving circuit according to claim 11, wherein the timing controller is connected with the power supply circuit by an Inter-Integrated Circuit (I2C) interface.

14. The driving circuit according to claim 2, wherein the longer the touch period is, the greater a difference between the first amplitude and the second amplitude is.

15. The driving circuit according to claim 1, wherein the power supply circuit includes: a power sub-circuit connected with the timing controller, and a level conversion sub-circuit connected between the power sub-circuit and each stage of shift register, wherein the power sub-circuit is configured for: in the first time period, under control of the timing controller, simultaneously outputting a first high-level voltage and a low-level voltage to the level conversion sub-circuit; and in the second time period, under control of the timing controller, simultaneously outputting a second high-level voltage and the low-level voltage to the level conversion sub-circuit, wherein the first high-level voltage is higher than the second high-level voltage; and the level conversion sub-circuit is configured for: upon receiving the first high-level voltage and the low-level voltage which are provided by the power sub-circuit, outputting the clock signal with the first amplitude to each stage of shift register; and upon receiving the second high-level voltage and the low-level voltage which are provided by the power sub-circuit, outputting the clock signal with the second amplitude to each stage of shift register.

16. The driving circuit according to claim 15, wherein the first amplitude is equal to a difference between the first high-level voltage and the low-level voltage, and the second amplitude is equal to a difference between the second high-level voltage and the low-level voltage.

17. The driving circuit according to claim 15, wherein the timing controller is connected with the power supply circuit by an Inter-Integrated Circuit (I2C) interface.

18. The driving circuit according to claim 1, wherein the longer the touch period is, the greater a difference between the first amplitude and the second amplitude is.

19. An in-cell touch screen, comprising the driving circuit according to claim 1.

20. A display apparatus, comprising the in-cell touch screen according to claim 19.

* * * * *